(12) United States Patent
Chang et al.

(10) Patent No.: US 7,462,844 B2
(45) Date of Patent: Dec. 9, 2008

(54) METHOD, SYSTEM, AND APPARATUS FOR IMPROVING DOPING UNIFORMITY IN HIGH-TILT ION IMPLANTATION

(75) Inventors: Shengwu Chang, South Hamilton, MA (US); Isao Tsunoda, Kanagawa-ken (JP); Nobihiro Tokoro, West Newbury, MA (US); Dennis Rodier, Francestown, NH (US); Joseph C. Olson, Beverly, MA (US); Donna Smatlak, Belmont, MA (US); Damian Brennan, Gloucester, MA (US); William Bintz, Londonderry, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 157 days.

(21) Appl. No.: 11/241,406

(22) Filed: Sep. 30, 2005

(65) Prior Publication Data

US 2007/0085037 A1 Apr. 19, 2007

(51) Int. Cl.
*H01J 37/08* (2006.01)
(52) U.S. Cl. .................................... 250/492.21
(58) Field of Classification Search ............ 250/492.21, 250/492.1, 492.23, 492.2, 492.3, 491.1; 438/514
See application file for complete search history.

(56) References Cited

U.S. PATENT DOCUMENTS

| | | | |
|---|---|---|---|
| 5,350,926 A | 9/1994 | White et al. | |
| 6,313,474 B1 * | 11/2001 | Iwasawa et al. | 250/492.21 |
| 6,740,894 B1 * | 5/2004 | Mitchell | 250/492.21 |
| 6,765,219 B2 * | 7/2004 | Berrian et al. | 250/492.21 |
| 6,992,309 B1 | 1/2006 | Petry et al. | |
| 6,992,310 B1 | 1/2006 | Ferrara et al. | |
| 2001/0032937 A1 * | 10/2001 | Berrian | 250/492.2 |
| 2001/0054698 A1 * | 12/2001 | Berrian | 250/492.3 |
| 2003/0066976 A1 * | 4/2003 | Chen et al. | 250/492.21 |
| 2003/0094583 A1 * | 5/2003 | Jang et al. | 250/492.21 |
| 2003/0197132 A1 * | 10/2003 | Keum et al. | 250/492.21 |
| 2004/0262532 A1 * | 12/2004 | Krueger | 250/397 |
| 2005/0082498 A1 * | 4/2005 | White | 250/492.21 |

\* cited by examiner

*Primary Examiner*—DAvid A. Vanore
*Assistant Examiner*—Michael Maskell

(57) ABSTRACT

The invention provides a method, system, and apparatus for improving doping uniformity during ion implantation, particularly during a high-tilt ion implantation. In one embodiment, the invention provides a method for improving doping uniformity in a high-tilt ion implantation, the method comprising the steps of: positioning a wafer along an axis perpendicular to an ion beam scan plane to form an angle between a surface of the wafer and a plane perpendicular to the ion beam; measuring a current of the ion beam by moving a current detector across the ion beam in a path substantially coplanar with a surface of the wafer; and adjusting a doping uniformity of the ion beam current based on the measuring step.

26 Claims, 10 Drawing Sheets

METHOD, SYSTEM, AND APPARATUS FOR IMPROVING DOPING UNIFORMITY IN HIGH-TILT ION IMPLANTATION

BACKGROUND OF THE INVENTION

1. Technical Field

The invention relates generally to ion implantation and more particularly to a method, system, and apparatus for improving doping uniformity in a high-tilt ion implantation.

2. Related Art

Ion beam implanters are widely used in the production of semiconductor wafers. An ion beam implanter generates a beam of positively-charged ions which, when applied to a surface of a semiconductor wafer, are implanted or "doped" onto the wafer surface. For example, FIG. 1 shows an orientation 100 of a wafer 110 in three dimensions X, Y, and Z. A planar surface of wafer 110 is oriented parallel to the X-axis and Y-axis, but perpendicular to the Z-axis. As such, an ion beam (not shown) delivered parallel to the Z-axis will strike the planar surface of wafer 110 at a 90 degree angle.

It may be desirable, however, to angle wafer 110 relative to the ion beam, such that the ion beam strikes the planar surface of wafer 110 at an angle other than 90 degrees. This may be done for any number of reasons, including, for example, in an attempt to prevent a channeling effect or to improve ion implantation on sidewalls of trench structures on the planar surface of the wafer. For example, FIG. 2 shows an orientation 200 of wafer 210 in three dimensions X, Y, and Z, wherein the planar surface of wafer 210 has been rotated about the X-axis such that an angle 212 (i.e., tilt angle $\theta_A$) is formed between wafer 210 and the Y-axis. Such an orientation is commonly employed, as noted above, to prevent a channeling effect or improve sidewall ion implantation.

However, orientations such as that of FIG. 2 are not without drawbacks. For example, the orientation 200 of FIG. 2 is non-isocentric, meaning that the position along the Z-axis at which an ion beam strikes wafer 210 varies relative to the Y-axis. The degree of variance generally increases as angle 212 increases and as the size of wafer 210 increases. Such variance may be extreme in high-tilt ion implantations, where angle 212 is often between about 10 degrees and about 60 degrees. Such differences may result in differences in ion beam currents and/or current densities, resulting in variances in dopant distribution along the surface of wafer 210.

Such variance may similarly be affected by structures on the surface of wafer 210. For example, referring to FIG. 3, a side view of a high-tilt orientation 300 of wafer 310 is shown. Wafer 310 has been rotated about the X-axis (into page) to form angle 312 between wafer 310 and the Y-axis. Wafer 310 includes a plurality of trench structures 314 on its surface. Trench structures 314 may be any known or later developed structure or feature forming sidewalls relative to a planar surface of wafer 310, including, for example, a trench, a channel, and a via.

Still referring to FIG. 3, an ion beam 320 directed parallel to the Z-axis strikes wafer 310 at different points along the Z-axis, due to the angle 312 of wafer 310 relative to the Y-axis. In addition, although ion beam 320 may be directed at equally spaced transmission intervals D1-5 relative to the Y-axis, due to trench structures 314, ion beam 320 will strike wafer 310 at varying incident intervals d1-5 relative to the Z-axis. Some incident intervals, such as d1 and d5, may be less than their corresponding transmission intervals (i.e., D1 and D5). Other incident intervals, such as d2, may be greater than their corresponding transmission intervals (i.e., D2). This situation further exacerbates the differences in ion beam currents and/or current densities along the Y-axis of the wafer caused by angle 312. As a result, dopant distribution may vary along the Y-axis of the wafer, the distribution being higher or lower at the wafer's edges relative to its center.

Others have described methods aimed at minimizing this variance in dopant distribution. For example, U.S. Pat. No. 6,313,474 to Iwasawa et al. describes a method comprising measuring a current density distribution at each of two points along a Z-axis and interpolating and/or extrapolating a current density distribution along the entire Z-axis. However, such a method provides only an approximation of the actual current density distribution along the wafer surface.

Accordingly, there is a need in the art for a method, system, and apparatus for improving doping uniformity during a high-tilt ion implantation.

SUMMARY OF THE INVENTION

The invention provides a method, system, and apparatus for improving doping uniformity during ion implantation, particularly during a high-tilt ion implantation. In one embodiment, the invention includes: positioning a wafer along an axis perpendicular to an ion beam scan plane to form an angle between a surface of the wafer and a plane perpendicular to the ion beam; scanning an ion beam according to at least one of a predetermined waveform of a scan voltage and a predetermined waveform of a scan current; measuring a current of the ion beam by moving a current detector across the beam in a path substantially coplanar with a surface of the wafer; determining an ion beam current density distribution from the current measured in the measuring step; and adjusting at least one of the scan voltage waveform and the scan current waveform based on the scanned beam current density distribution.

A first aspect of the invention provides a method for improving doping uniformity in a high-tilt ion implantation, the method comprising the steps of: positioning a wafer along an axis perpendicular to an ion beam scan plane to form an angle between a surface of the wafer and a plane perpendicular to the ion beam; measuring a current of the ion beam by moving a current detector across the ion beam in a path substantially coplanar with a surface of the wafer; and adjusting a doping uniformity of the ion beam current based on the measuring step.

A second aspect of the invention provides a system for improving doping uniformity in a high-tilt ion implantation, the system comprising: means for positioning a wafer along an axis perpendicular to an ion beam scan plane to form an angle between a surface of the wafer and a plane perpendicular to the ion beam; means for measuring a current of the ion beam by moving a current detector across the ion beam in a path substantially coplanar with a surface of the wafer; and means for adjusting a doping uniformity of the ion beam current.

A third aspect of the invention provides an ion implantation device having: a wafer-handling apparatus adapted to position a wafer along an axis perpendicular to an ion beam scan plane to form an angle between a surface of the wafer and a plane perpendicular to the ion beam; and a current detector adapted to be moved along a path coplanar with a surface of the wafer.

A fourth aspect of the invention provides a method for improving ion beam uniformity in an ion implantation, the method comprising the steps of: positioning a wafer along an axis perpendicular to an ion beam scan plane to form an angle between a surface of the wafer and a plane perpendicular to the ion beam; measuring a current of the ion beam by moving a current detector across the ion beam; adjusting a uniformity of the ion beam current based on the measuring step; and scanning the wafer through the ion beam.

A fifth aspect of the invention provides a program product stored on a computer-readable medium, which when executed, improves doping uniformity in a high-tilt ion implantation, the program product comprising: program code for instructing a wafer-handling device to position a wafer along an axis perpendicular to an ion beam scan plane to form an angle between a surface of the wafer and a plane perpendicular to the ion beam; program code for instructing a current measuring device to measure a current of the ion beam by moving the current detector across the ion beam in a path substantially coplanar with a surface of the wafer; and program code instructing an ion beam control device to improve a uniformity of the ion beam current.

A sixth aspect of the invention provides a business method for improving doping uniformity in a high-tilt ion implantation, the business method comprising managing a computer infrastructure that performs each of the steps of the invention; and receiving payment based on the managing step.

A seventh aspect of the invention provides a method of generating a system for improving doping uniformity in a high-tilt ion implantation, the method comprising: obtaining a computer infrastructure; and deploying means for performing each of the steps of the invention to the computer infrastructure.

The foregoing and other features of the invention will be apparent from the following more particular description of embodiments of the invention.

DETAILED DESCRIPTION

Figure 1:
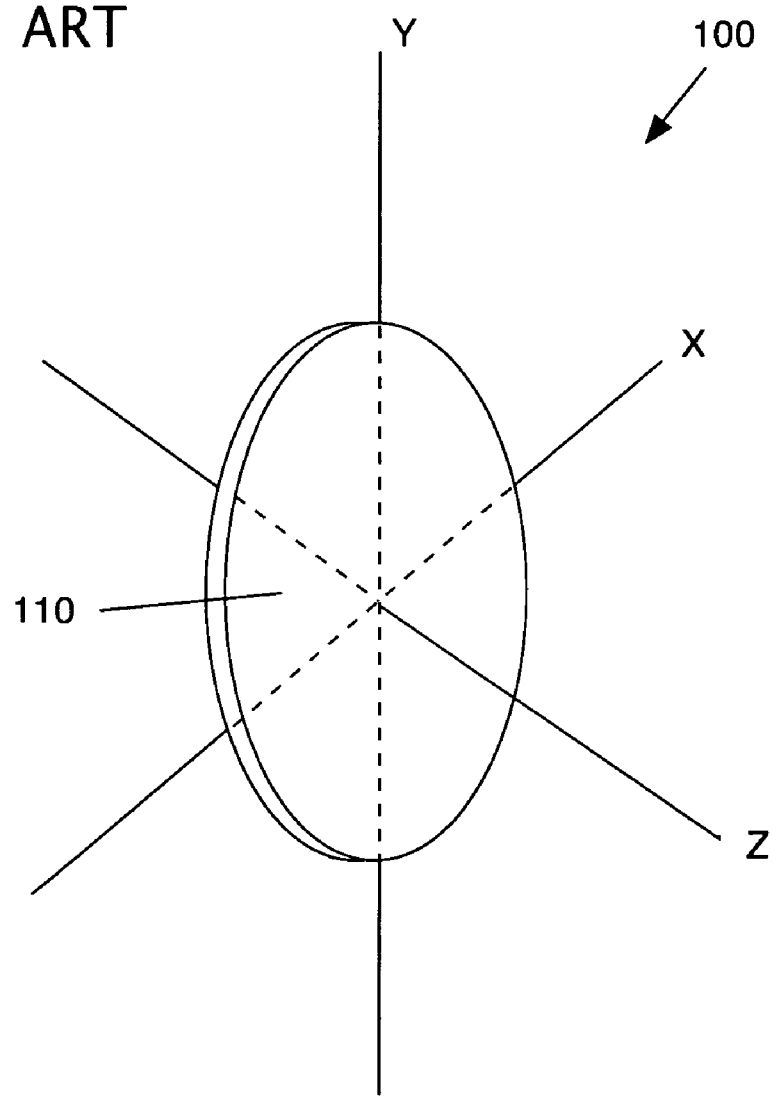
FIG. 1 shows a first prior art orientation of a semiconductor wafer.
Figure 2:
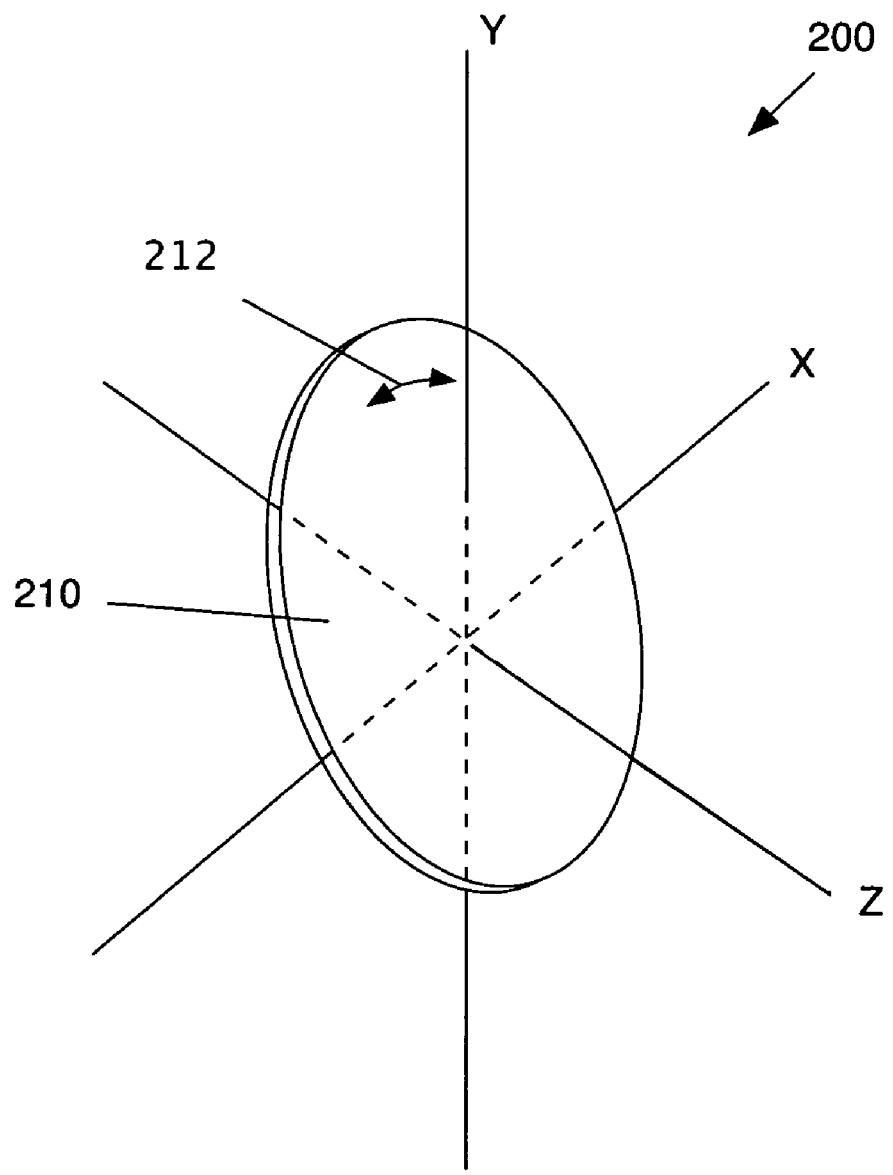
FIG. 2 shows a second prior art orientation of a semiconductor wafer.
Figure 3:
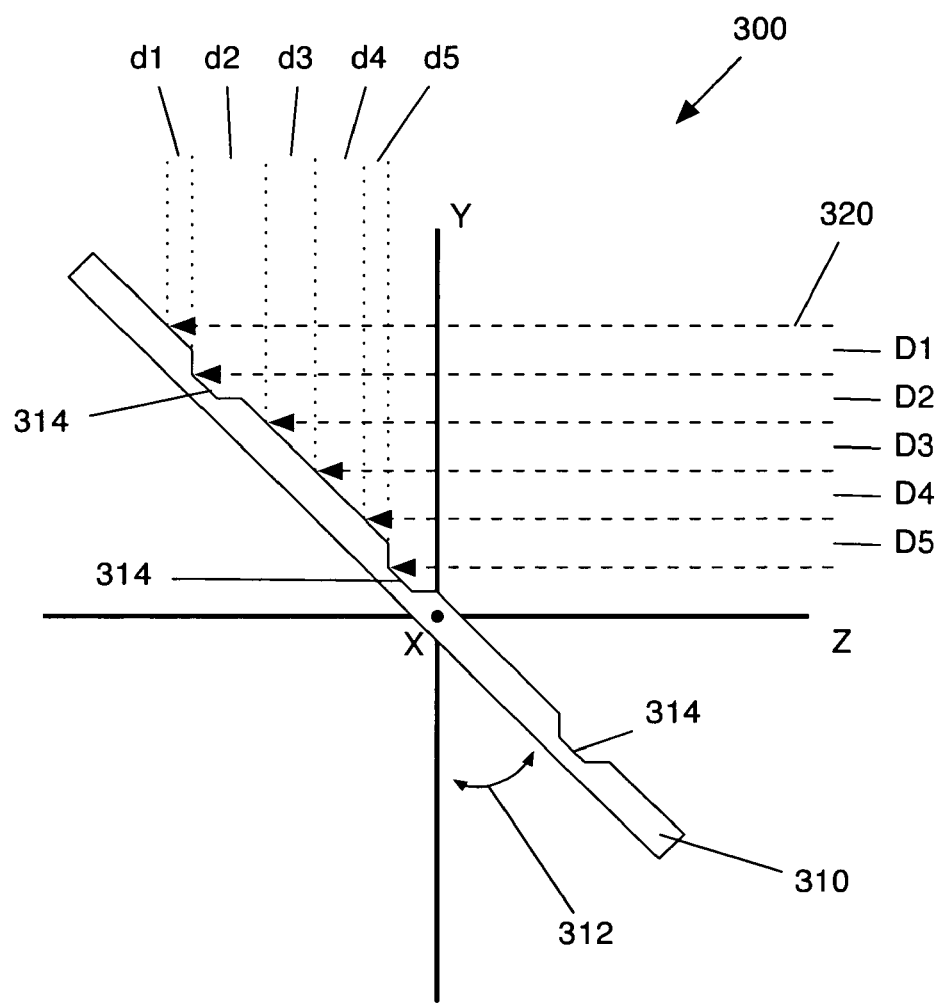
FIG. 3 shows a side view of a prior art high-tilt orientation of a semiconductor wafer.
Figure 4:
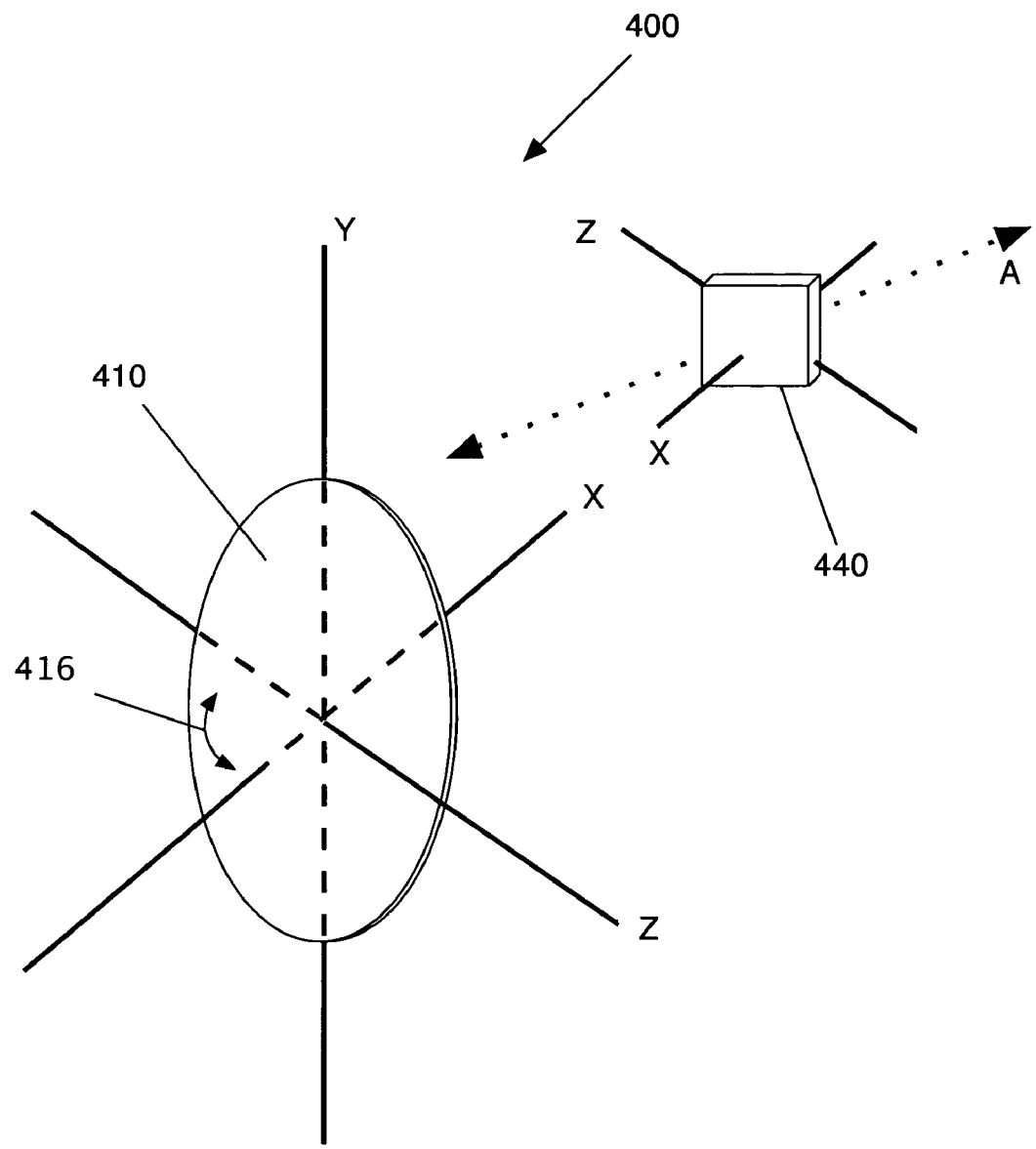
FIG. 4 shows an orientation of a semiconductor wafer and a traveling Faraday cup according to an embodiment of the invention.

Referring now to FIG. 4, an orientation 400 of wafer 410 is shown in three dimensions, X, Y, and Z. Unlike known orientations such as those described above with respect to FIGS. 1-3, the orientation of the present invention includes an angle 416 (i.e., tilt angel $\theta_B$) between a surface of wafer 410 and the X-axis, formed by rotating wafer 410 about the Y-axis. That is, the wafer is rotated about an axis (i.e., the Y-axis) that is perpendicular to an ion beam scan plane (i.e., the X-Z plane). Thus, the Y and Z axes remain isocentric in one orientation 400. It should be understood that the orientation shown is merely illustrative of a three-dimensional orientation and is meant to show each axis as perpendicular to the other two axes rather than any particular orientation of the axes in space.

Still referring to FIG. 4, in one embodiment of the invention, a current detector 440 (e.g., a Faraday cup) is movable along two axes (i.e., the X- and Z-axes). This movement is in marked contrast to known current detectors, which are movable only along one axis, generally the X-axis. Two-dimensional current detector 440 enables movement along path A. In one embodiment, path A is defined as $Z=\tan \theta_B * X + C$, wherein $\theta_B$ is angle 416 and C is a constant determined by the origin of the coordinate system. This path is the intersection formed between wafer 410 and the X-Z coordinate plane during ion implantation, i.e., a path coplanar with the surface of wafer 410. Movement of current detector 440 along this path enables measurement of an ion beam current and determination of a spot beam profile and ion beam current density distribution along the surface of wafer 410. An ion beam current density distribution includes, for example, a scanned beam current density distribution, in the case that a scanned beam ion implanter is employed.

It should be noted, however, that path A need not be coplanar with a surface of wafer 410 in order to improve doping uniformity. For example, movement of current detector 440 along any path between one along the X-axis and one coplanar with a surface of wafer 410, will permit an improvement in doping uniformity. Similarly, movement of current detector 440 along a path having an angle relative to the X-axis that is greater than angle 416 may also permit an improvement in doping uniformity. In either situation, current detector 440 moves along a path that is substantially coplanar with a surface of wafer 410. Alternatively, in the case that angle 416 is small (e.g., less than about 10 degrees), the variance in dopant distribution caused by angle 416 may be small and it may therefore be unnecessary to move current detector 440 along any path other than one along the X-axis.

Figure 5:
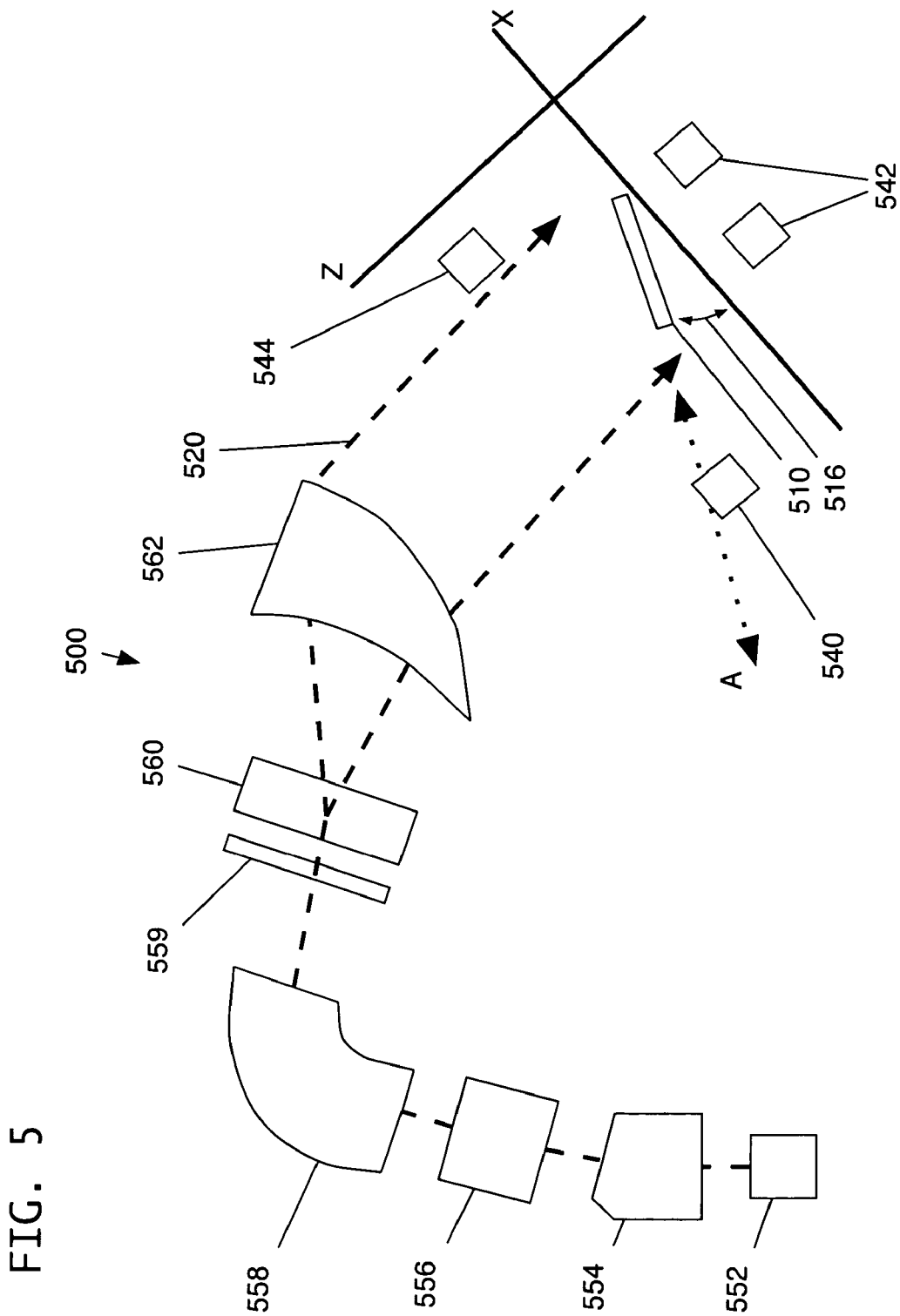
FIG. 5 shows an ion implanter according to an embodiment of the invention.

Referring now to FIG. 5, an ion implanter 500 is shown according to one embodiment of the invention. As is known in the art, ion implanter 500 may include an ion source 552, a filter magnet 554, an acceleration/deceleration column 556, an analyzer magnet 558, an electrostatic lens and/or an electromagnetic lens 559, a scanner 560, and a corrector magnet 562. Ion implanter 500 may further include a dose control Faraday cup 544 and sampling Faraday cups 542. As described above, wafer 510 is rotated about the Y-axis (not shown), forming an angle 516 between wafer 510 and the X-axis. Unlike ion implanters known in the art, ion implanter 500 includes a traveling Faraday cup 540 moveable along the X and Z-axes. Specifically, traveling Faraday cup 540 is movable along path A, corresponding to a path substantially coplanar with a surface of wafer 510.

While shown in FIG. 5 as a scanned beam ion implanter, one having skill in the art will recognize that a ribbon beam ion implanter may similarly be used. In such a case, beamline optics may be adjusted in order to improve ion beam uniformity and, therefore, doping uniformity. In addition, one having skill in the art will recognize that an ion beam may be scanned using an electric deflector or a magnetic deflector. Accordingly, the ion beam may be scanned according to a voltage waveform or a current waveform, respectively.

Figure 6A:
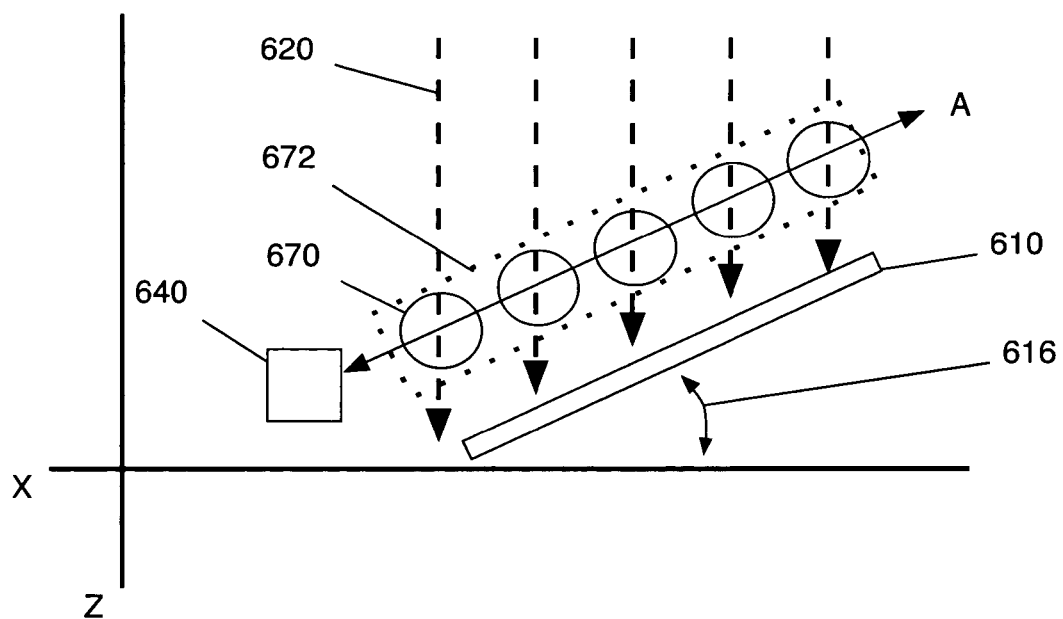
FIGS. 6A and 6B show, respectively, the scanning of an ion beam and the resulting spot beam profiles and scanned beam current density distribution according to an embodiment of the invention.
Figure 6B:
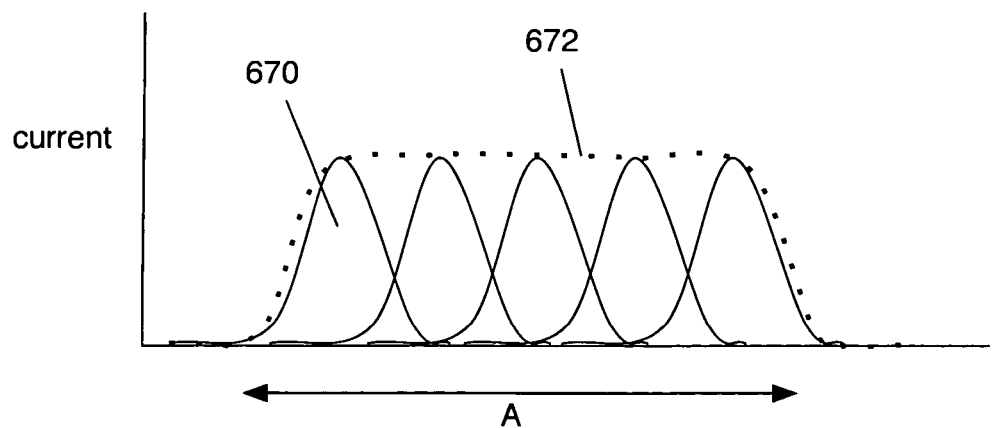

Traveling Faraday cup 540 permits determination of a spot beam profile and/or an ion beam current density distribution at any of a number of points along path A. For example, FIGS. 6A-B show, respectively, traveling Faraday cup 640 moving along path A and an illustration of the spot beam profiles 670 and scanned beam current density distribution 672 determined from the current measurements made by traveling Faraday cup 640. While measuring spot beam profiles 670, ion beam 620 is slowly moved across a momentarily stationary traveling Faraday cup 640 at each location along path A at which a measurement is desired. Contrarily, while measuring an ion beam current density distribution 672, traveling Faraday cup 640 is preferably moved across the ion beam 620 along path A. Ion beam 620 is preferably scanned according to at least one of a predetermined waveform of a scan voltage and a predetermined waveform of a scan current.

To maximize the uniformity of dopant distribution afforded by the present invention, it may be necessary to (1) equalize spot beam profiles 670 in magnitude, and/or (2) equalize the distances between pairs of spot beam profiles 670 and their corresponding locations along path A (FIG. 6A). Spot beam profiles 670 may be equalized in magnitude by, for example, adjusting at least one lens 559 (FIG. 5). Lens 559 may be, for example, an electrostatic lens and/or an electromagnetic lens. Such lens adjustment may be made in coordination with an alteration in a scanner voltage, a scanner current, or an ion beam scanning position. Equalizing the distances between pairs of spot beam profiles 670 and their corresponding locations along path A may be achieved, for example, by adjusting a corrector magnet 562 (FIG. 5).

In some implants, the uniformity of dopant distribution may not be as critical as the distribution of angles across the wafer. In such an implant, traveling Faraday cup 640 (FIG. 6A) need not be moved along path A (FIG. 6A). Rather, it is sufficient that wafer 610 (FIG. 6A) be rotated about the Y-axis such that it is angled relative to the X-axis.

For example, referring again to FIG. 5, while magnet 562 is used to make beam 520 parallel along its length (i.e., beam 520 is made parallel to the Z-axis), magnet 562 does not make beam 520 parallel with respect to the Y-axis. Rather, ion beam 520 may have any number of orientations relative to the Y-axis.

Figure 7A:
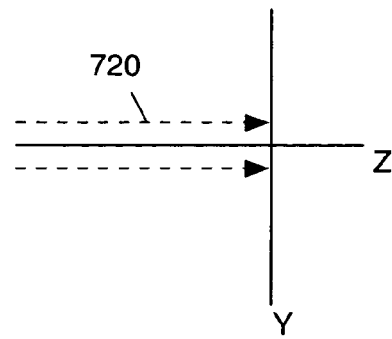
FIGS. 7A-D show a number of vertical orientations of an ion beam.
Figure 7B:
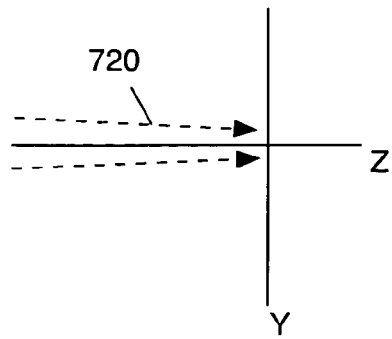
Figure 7C:
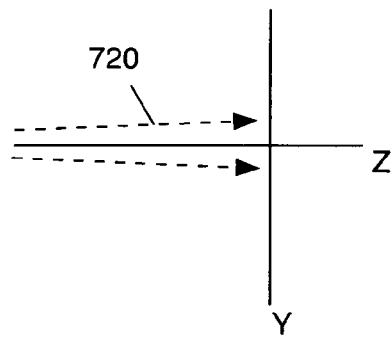
Figure 7D:
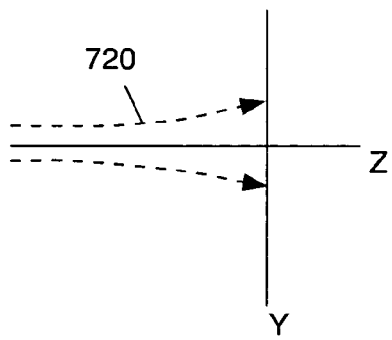

For example, FIGS. 7A-D show four orientations of beam 720 relative to the Y-axis. In FIG. 7A, beam 720 is parallel to the Y-axis. In FIG. 7B, beam 720 is converging toward the Y-axis in a linear manner. In FIG. 7C, beam 720 is diverging toward the Y-axis in a linear manner. In FIGS. 7B and 7C, the density of beam 720 changes along the Z-axis. Finally, in FIG. 7D, beam 720 is diverging toward the Y-axis in a non-linear manner. Here, not only does the density of beam 720 change along the Z-axis, but its angle relative to the Y-axis changes as well. Such non-linear divergence may occur, for example, if the ions in beam 720 are not being well neutralized.

Generally, beam 720 will include most or all of the orientations in FIGS. 7A-D. As such, the uniformity of implantation in the vertical direction (i.e., along the Y-axis) relies on mechanically scanning the wafer through beam 720 to expose the wafer surface to all orientations of beam 720 relative to the Y-axis. Doing so exposes the wafer to the entire distribution of beam densities and angles present in beam 720.

Figure 7E:
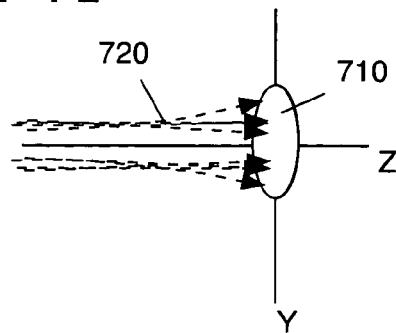
FIG. 7E shows the ion beam orientations of FIGS. 7A-D relative to a wafer angled according to an embodiment of the invention.

In FIG. 7E, wafer 710 is angled about the Y-axis, as described above with respect to FIG. 4, such that a surface of wafer 710 is parallel to the direction of mechanical scan. Such an orientation exposes wafer 710 to an averaged distribution of beam densities and angles. As can be seen in FIG. 7E, the various orientations of beam 720 are evenly distributed across a surface of wafer 710 as wafer 710 is scanned through beam 720.

Figure 8:
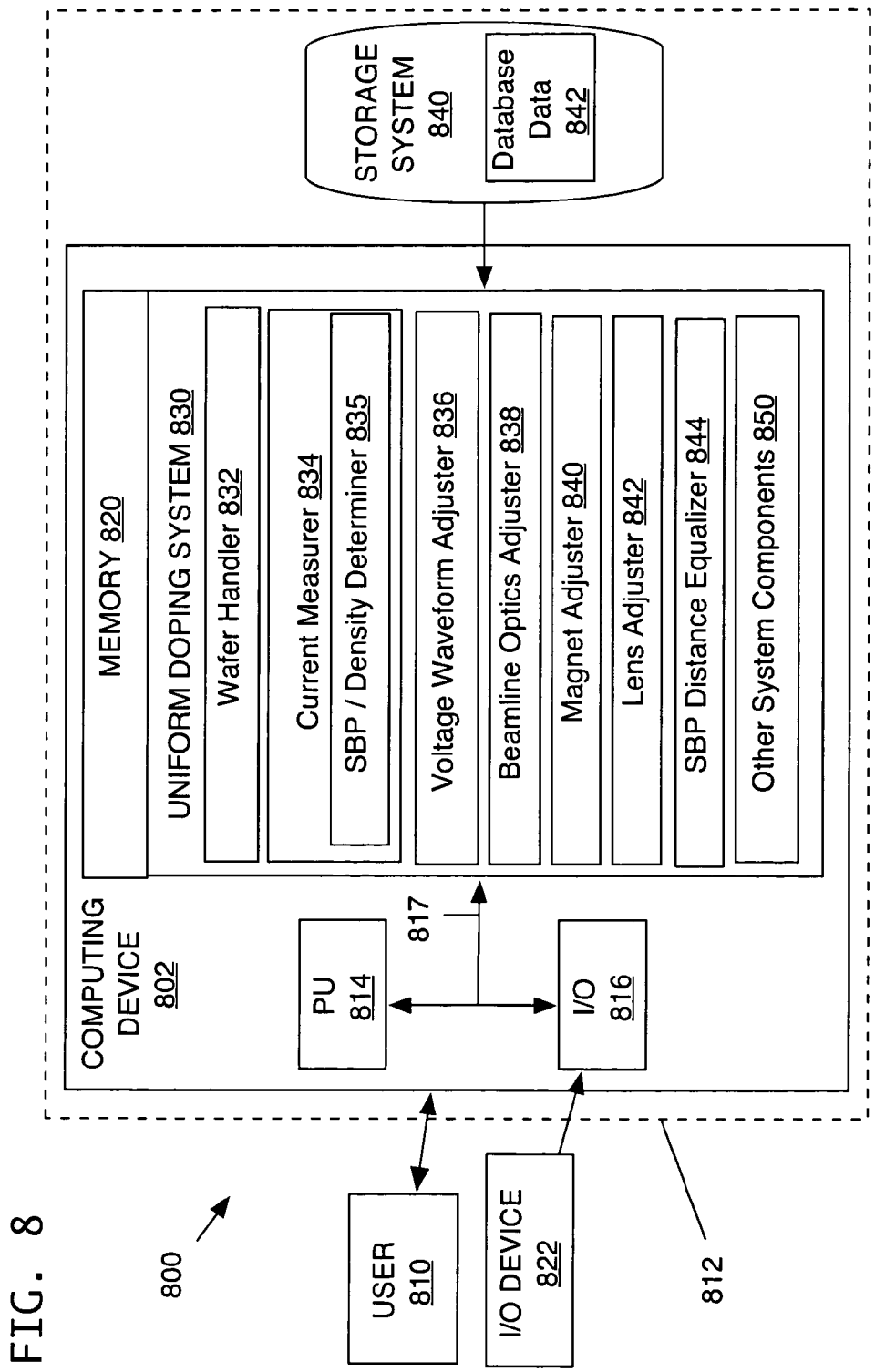
FIG. 8 shows a system according to an embodiment of the invention.

FIG. 8 shows an illustrative system 800 for improving doping uniformity in a high-tilt ion implantation. To this extent, system 800 includes a computer infrastructure 812 that can perform the various process steps described below for improving doping uniformity. In particular, computer infrastructure 812 is shown including a computing device 802 that comprises a uniform doping system 830, which enables computing device 802 to improve doping uniformity by performing the process steps of the invention.

Computing device 802 is shown including a processing unit (PU) 814, a memory 820, an input/output (I/O) interface 816, and a bus 817. Further, computing device 802 is shown in communication with an external I/O device/resource 822 and a storage system 840. As is known in the art, in general, processing unit 814 executes computer program code, such as uniform doping system 830, that is stored in memory 820 and/or storage system 840. While executing computer program code, processing unit 814 can read and/or write data to/from memory 820, storage system 840 (which may include, for example, database data 842), and/or I/O interface 816. Bus 817 provides a communication link between each of the components in computing device 802. I/O device/resource 822 can comprise any device or resource that enables user 810 to interact with computing device 802 or any device that enables computing device 802 to communicate with one or more other computing devices.

In any event, computing device 802 can comprise any general purpose computing article of manufacture capable of executing computer program code installed by a user 810 (e.g., a personal computer, server, handheld device, etc.). However, it is understood that computing device 802 and uniform doping system 830 are only representative of various possible computing devices that may perform the various process steps of the invention. To this extent, in other embodiments, computing device 802 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 812 is only illustrative of various types of computer infrastructures for implementing the invention. For example, in one embodiment, computer infrastructure 812 comprises two or more computing devices (e.g., a server cluster) that communicate over any type of wired and/or wireless communications link, such as a network, a shared memory, or the like, to perform the various process steps of the invention. When the communications link comprises a network, the network can comprise any combination of one or more types of networks (e.g., the Internet, a wide area network, a local area network, a virtual private network, etc.). Regardless, communications between the computing devices may utilize any combination of various types of transmission techniques.

Uniform doping system 830 enables computing device 802 to improve doping uniformity in an ion implantation, and particularly in a high-tilt ion implantation. To this extent, uniform doping system 830 is shown including a wafer handler 832, a current measurer 834, a voltage waveform adjuster 836, a beamline optics adjuster 838, a magnet adjuster 840, a lens adjuster 842, and a spot beam profile (SBP) distance equalizer 844. The operation of each is described in greater detail below. Current measurer 834 may further include a spot beam profile and/or scanned beam current density distribution determiner 835. Other system components 850 may similarly be included to provide additional functionality to uniform doping system 830. It is understood that some of the various systems shown in FIG. 8 can be implemented independently, combined, and/or stored in memory for one or more separate computing devices 802 that communicate over a network. Further, it is understood that some of the systems and/or functionality may not be implemented, or additional systems and/or functionality may be included as part of system 800.

Figure 9:
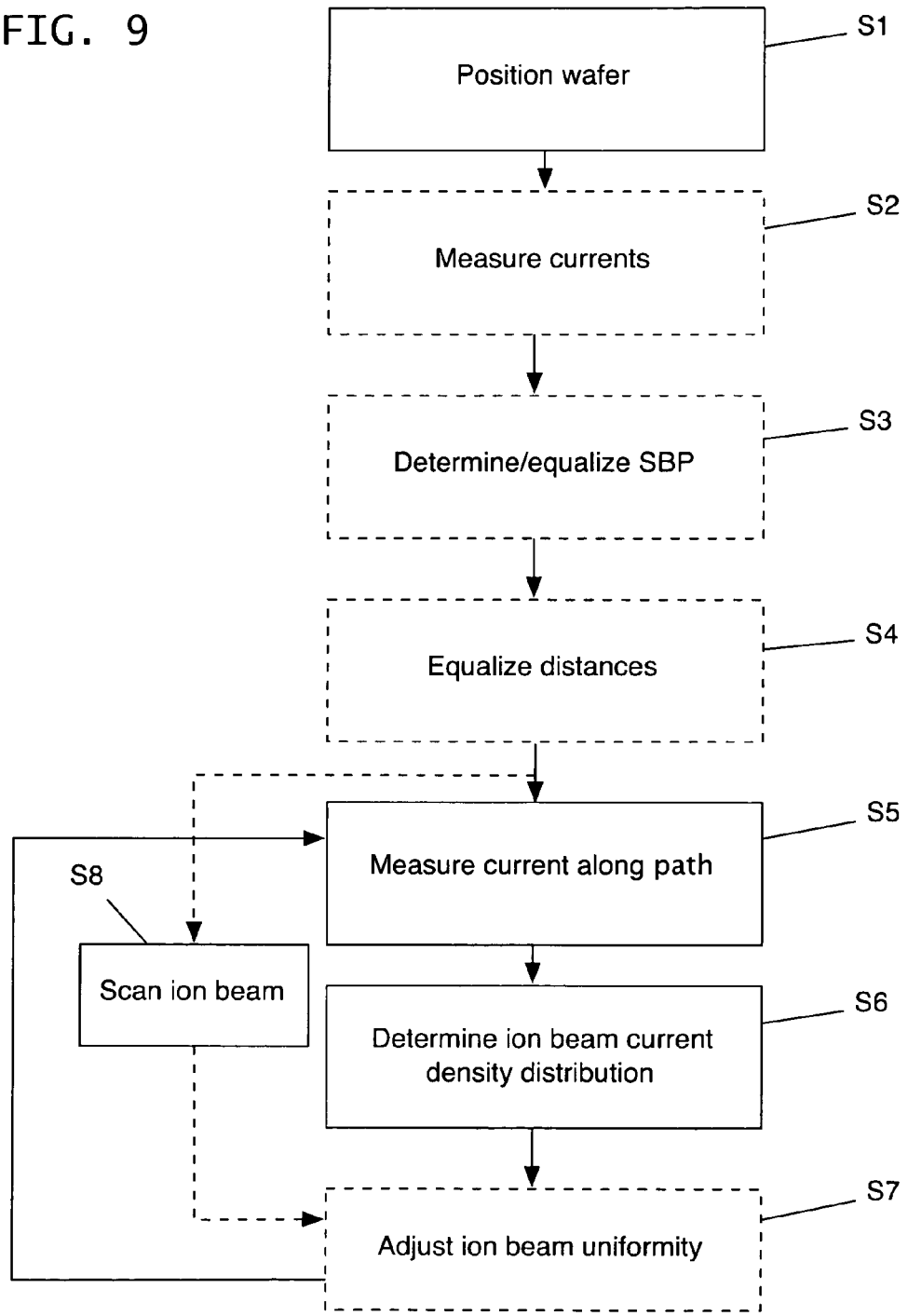
FIG. 9 shows a flow chart of a method according to an embodiment of the invention.

Referring now to FIG. 9, a diagram of one embodiment of a method of the present invention is shown. At step S1, a wafer handler 832 (FIG. 8) positions a wafer along an axis perpendicular to an ion beam scan plane (e.g., the Y-axis), forming an angle between the wafer surface and a plane perpendicular to the ion beam (e.g., the X-Y plane), as described above. Next, at optional step S2, a traveling Faraday cup 440 (FIG. 4) measures ion beam currents at each of a plurality of locations along a path substantially coplanar with the angled surface of the wafer of step S1.

At optional step S3, a spot beam profile determiner 835 (FIG. 8) determines spot beam profiles (SBPs) from the measured currents of step S2. In addition, a lens adjuster 842 (FIG. 8) optionally adjusts a lens, e.g., an electrostatic lens and/or an electromagnetic lens 559 (FIG. 5) to equalize the magnitudes of the spot beam profiles. Such adjustment may be made in coordination with an alteration in a scanner voltage, a scanner current, or an ion beam scanning position. At optional step S4, an SBP distance equalizer 844 (FIG. 8) equalizes the distances between pairs of spot beam profiles with the distances between corresponding locations along the path in step S2 by employing a magnet adjuster 840 (FIG. 8) to adjust a corrector magnet 562 (FIG. 5). If optional step S3 is not included, spot beam profiles may be determined at step S4 prior to equalizing the distances.

At step S5, a traveling Faraday cup 440 (FIG. 4) measures a current along the path in step S2. At step S6, a density distribution determiner 835 (FIG. 8) determines an ion beam current density distribution from the current measured in step S5. At optional step S7, a uniformity of the ion beam is adjusted based upon the ion beam current density distribution determined at step S6 by, for example, employing a voltage waveform adjuster 836 (FIG. 8) to adjust a scan voltage waveform. For example, if the ion beam current density is greater at one area of the wafer, the dV/dt of the scan voltage waveform V(t) may be increased in this area to reduce the current at the area and therefore reduce the dopant density. If, on the other hand, the scanned beam current density is less in an area of the wafer, the dV/dt of scan voltage waveform V(t) may be reduced in this area to increase the current applied to the area, thereby improving the dopant density. To achieve a uniform dopant density, the dV/dt of the scan voltage waveform may be increased along some areas of the wafer surface and reduced in other areas. Alternatively, a current waveform adjuster (not shown) may be employed to adjust a scan current waveform, in the case that a magnetic ion beam deflector is used.

Steps S5, S6, and S7 may be iterated in a loop until a uniformity target is achieved or some other condition indicates cessation of the loop (e.g., a predetermined number of iterations are performed, uniformity decreases, etc.).

Optionally, in the case that a scanned beam ion implanter is employed, before measuring the ion beam current at step S5, ion beam 520 (FIG. 5) is scanned according to a predetermined waveform of a scan voltage (or scan current) at step S8. Scanning generally continues during steps S6 and optional step S7.

Figure 10:
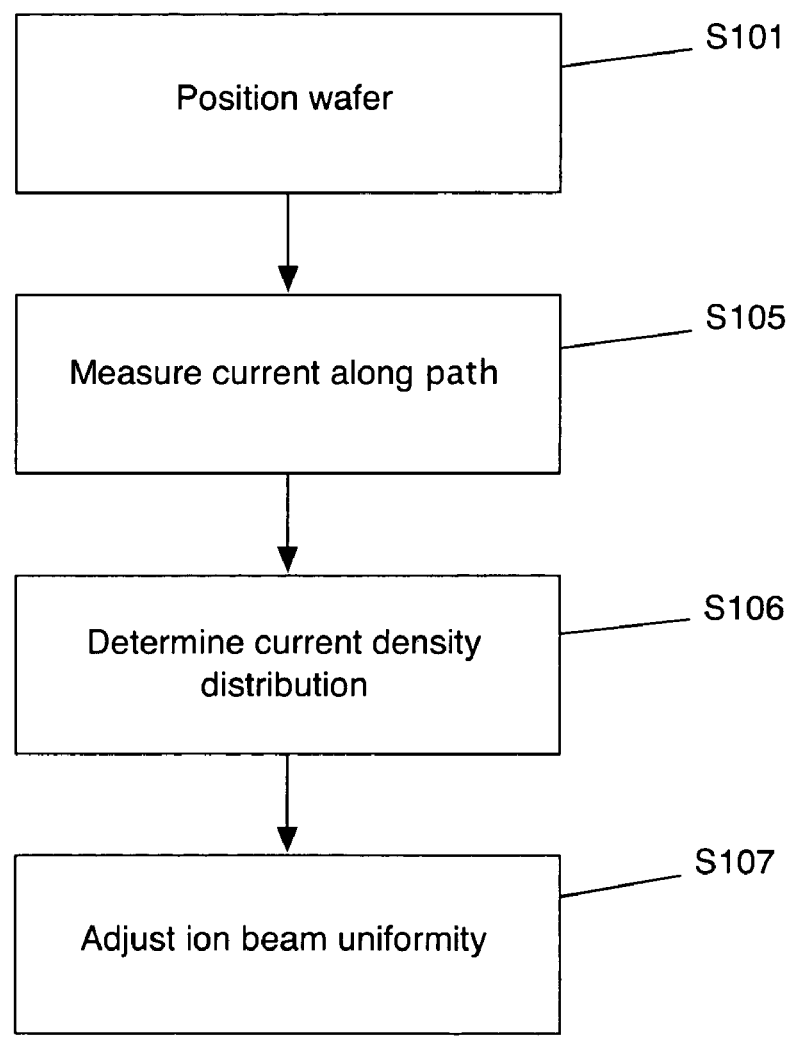
FIG. 10 shows a flow chart of an alternative method according to an embodiment of the invention.

Referring to FIG. 10, an illustrative alternative method of the invention is shown. The method of FIG. 10 may be employed, as described above, in the case that the ion implantation includes a ribbon beam ion implanter. At step S101, a wafer handler 832 (FIG. 8) positions a wafer along an axis perpendicular to an ion beam, forming an angle between the wafer surface and a plane perpendicular to the ion beam (e.g., the X-Y plane). At step S105, a traveling Faraday cup 440 (FIG. 8) measures a current along a path. As described above, the path may be substantially coplanar with a surface of the wafer. At step S106, a density distribution determiner 835 (FIG. 8) determines an ion beam current density distribution from the current measured in step S105. Finally, at step S107, a uniformity of the ion beam is adjusted by, for example, employing beamline optics adjuster 838 (FIG. 8) to adjust beamline optics (not shown).

The methods depicted in FIGS. 9-10 are illustrative of methods of the present invention. The steps of the methods of FIGS. 9-10 may be performed in different orders and additional steps may be included within a method according to the present invention.

While shown and described herein as a method, system, and apparatus for improving doping uniformity, it is understood that the invention further provides various alternative embodiments. For example, in one embodiment, the invention provides a computer-readable medium that includes computer program code to enable a computer infrastructure to improve doping uniformity. To this extent, the computer-readable medium includes program code, such as uniform doping system 830, that implements each of the various process steps of the invention. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 820 (FIG. 8) and/or storage system 840 (FIG. 8) (e.g., a fixed disk, a read-only memory, a random access memory, a cache memory, etc.), and/or as a data signal traveling over a network (e.g., during a wired/wireless electronic distribution of the program code).

In another embodiment, the invention provides a business method that performs the process steps of the invention on a subscription, advertising, and/or fee basis. That is, a service provider, such as an Internet Service Provider, could offer to improve doping uniformity as described above. In this case, the service provider can create, maintain, support, etc., a computer infrastructure, such as computer infrastructure 812, that performs the process steps of the invention for one or more customers. In return, the service provider can receive payment from the customer(s) under a subscription and/or fee agreement and/or the service provider can receive payment from the sale of advertising space to one or more third parties.

In still another embodiment, the invention provides a method of generating a system for improving doping uniformity. In this case, a computer infrastructure, such as computer infrastructure 812, can be obtained (e.g., created, maintained, having made available to, etc.) and one or more systems for performing the process steps of the invention can be obtained (e.g., created, purchased, used, modified, etc.) and deployed to the computer infrastructure. To this extent, the deployment of each system can comprise one or more of (1) installing program code on a computing device, such as computing device 802, from a computer-readable medium; (2) adding one or more computing devices to the computer infrastructure; and (3) incorporating and/or modifying one or more existing systems of the computer infrastructure, to enable the computer infrastructure to perform the process steps of the invention.

As used herein, it is understood that the terms "program code" and "computer program code" are synonymous and mean any expression, in any language, code or notation, of a set of instructions intended to cause a computing device having an information processing capability to perform a particular function either directly or after either or both of the following: (a) conversion to another language, code or notation; and (b) reproduction in a different material form. To this extent, program code can be embodied as one or more types of program products, such as an application/software program, component software/library of functions, an operating system, a basic I/O system/driver for a particular computing and/or I/O device, and the like.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for improving doping uniformity in a high-tilt ion implantation, the method comprising the steps of:
   positioning a wafer along an axis perpendicular to an ion beam scan plane to form an angle between a surface of the wafer and a plane perpendicular to the ion beam;
   measuring a current of the ion beam at each of a plurality of locations by moving a current detector across the ion beam in the two dimensions of the ion beam scan plane in a path substantially coplanar with a surface of the wafer, the current detector measuring current at the plurality of locations that form a line;
   determining a spot beam profile from the current measured at each of the plurality of locations;
   adjusting at least one of an electrostatic lens and an electromagnetic lens such that a first and second dimension of each spot beam profile determined for each of the plurality of locations is substantially the same; and
   adjusting a uniformity of the ion beam current based on the measuring step.

2. The method of claim 1, further comprising the step of:
   scanning an ion beam according to at least one of a predetermined waveform of a scan voltage and a predetermined waveform of a scan current.

3. The method of claim 2, wherein the adjusting step includes:
   determining an ion beam current density distribution from the current measured in the measuring step; and
   adjusting at least one of the scan voltage waveform and the scan current waveform based on the ion beam current density distribution.

4. The method of claim 1, wherein the current detector is stationary while measuring a current at each of the plurality of locations.

5. The method of claim 1, wherein the at least one of an electrostatic lens and an electromagnetic lens is adjusted in coordination with an alteration in one of: a scanner voltage, a scanner current, and an ion beam scanning position.

6. The method of claim 1, further comprising the step of adjusting a corrector magnet such that a distance between any two spot beam profiles is equal to a distance between two corresponding locations along the path substantially coplanar with a surface of the wafer.

7. The method of claim 1, wherein the adjusting step includes adjusting beamline optics.

8. The method of claim 1, wherein the positioning step includes rotating the wafer about the axis.

9. The method of claim 1, wherein the angle formed between the surface of the wafer and the plane perpendicular to the ion beam is between about 10 degrees and about 60 degrees.

10. A system for improving doping uniformity in a high-tilt ion implantation, the system comprising:
    means for positioning a wafer along an axis perpendicular to an ion beam scan plane to form an angle between a surface of the wafer and a plane perpendicular to the ion beam;
    means for measuring a current of the ion beam at each of a plurality of locations by moving a current detector across the ion beam to each of the plurality of locations in the two dimension of the ion beam scan plane in a path substantially coplanar with a surface of the wafer, the current detector measuring current at the plurality of locations that form a line;
    means for determining a spot beam profile from the current measured at each of the plurality of locations;
    means for adjusting at least one of an electrostatic lens and an electromagnetic lens such that a first and second dimension of each spot beam profile determined for each of the plurality of locations is substantially the same; and
    means for adjusting a uniformity of the ion beam current.

11. The system of claim 10, further comprising:
    means for scanning an ion beam according to at least one of a predetermined waveform of a scan voltage and a predetermined waveform of a scan current.

12. The system of claim 11, wherein the means for adjusting a uniformity of the ion beam current includes:
    means for determining an ion beam current density distribution from the current measured by the means for measuring; and
    means for adjusting at least one of the scan voltage waveform and the scan current waveform based on the current density distribution.

13. The system of claim 10, wherein the current detector is stationary while measuring a current at each of the plurality of locations.

14. The system of claim 10, wherein the at least one of an electrostatic lens and an electromagnetic lens is adjusted in coordination with an alteration in one of: a scanner voltage, a scanner current, and an ion beam scanning position.

15. The system of claim 10, further comprising means for adjusting a corrector magnet such that a distance between any two spot beam profiles is equal to a distance between two corresponding locations along the path substantially coplanar with a surface of the wafer.

16. The system of claim 10, wherein the means for adjusting includes means for adjusting beamline optics.

17. The system of claim 10, wherein positioning means includes means for rotating the wafer about the axis.

18. The system of claim 10, wherein the angle formed between the surface of the wafer and the plane perpendicular to the ion beam is between about 10 degrees and about 60 degrees.

19. A method for improving ion beam uniformity in an ion implantation, the method comprising the steps of:
    positioning a wafer along an axis perpendicular to an ion beam scan plane to form an angle between a surface of the wafer and a plane perpendicular to the ion beam;

measuring a current of the ion beam by moving a current detector to each of a plurality of locations across the ion beam in the two dimensions of the ion beam scan plane, the current detector measuring current at the plurality of location that form a line;

determining a spot beam profile form the current measured at each of the plurality of locations;

adjusting at least one of an electrostatic lens and an electromagnetic lens such that a first and second dimension of each spot beam profile determined for each of the plurality of locations is substantially the same; and adjusting a uniformity of the ion beam current based on the measuring step.

20. The method of claim 19, wherein the positioning step includes orienting a surface of the wafer parallel to a scan direction.

21. The method of claim 19, further comprising the step of:

scanning the ion beam according to at least one of a predetermined waveform of a scan voltage and a predetermined waveform of a scan current.

22. The method of claim 21, wherein the adjusting step includes:

determining an ion beam current density distribution from the current measured in the measuring step; and adjusting at least one of the scan voltage waveform and the scan current waveform based on the scanned beam current density distribution.

23. The method of claim 19, wherein the at least one of an electrostatic lens and an electromagnetic lens is adjusted in coordination with an alteration in one of: a scanner voltage, a scanner current, and an ion beam scanning position.

24. The method of claim 19, further comprising the step of adjusting a corrector magnet such that a distance between any two spot beam profiles is equal to a distance between two corresponding locations along a path along which the current detector is moved.

25. The method of claim 19, wherein the adjusting step includes adjusting beamline optics.

26. The method of claim 19, wherein the positioning step includes rotating the wafer about the axis.

* * * * *